US006162586A

United States Patent [19]
Sengupta et al.

[11] Patent Number: 6,162,586
[45] Date of Patent: *Dec. 19, 2000

[54] METHOD FOR SUBSTANTIALLY PREVENTING FOOTINGS IN CHEMICALLY AMPLIFIED DEEP ULTRA VIOLET PHOTORESIST LAYERS

[75] Inventors: Samit S. Sengupta, San Jose; Daniel C. Baker, Milpitas; Subhas Bothra, San Jose, all of Calif.

[73] Assignee: Philips Electronics North America Corp., New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/073,734

[22] Filed: May 6, 1998

[51] Int. Cl.$^7$ ...................................................... G03C 5/00

[52] U.S. Cl. .......................... 430/314; 430/313; 430/316; 430/318

[58] Field of Search ...................................... 430/313, 314, 430/318, 316; 204/192.17, 192.11, 298.04; 427/576

[56] References Cited

U.S. PATENT DOCUMENTS

| | | | |
|---|---|---|---|
| 4,820,611 | 4/1989 | Arnold, III et al. | 430/271 |
| 5,192,697 | 3/1993 | Leong | 437/37 |
| 5,302,551 | 4/1994 | Iranmanesh | 437/195 |
| 5,306,952 | 4/1994 | Matsuura et al. | 257/165 |
| 5,582,881 | 12/1996 | Besser et al. | 427/576 |
| 5,635,763 | 6/1997 | Inoue et al. | 257/763 |
| 5,686,356 | 11/1997 | Jain et al. | 437/195 |
| 5,702,870 | 12/1997 | Brugge | 430/195 |
| 5,743,998 | 4/1998 | Park | 156/628.1 |
| 5,757,060 | 5/1998 | Lee et al. | 257/529 |
| 5,759,916 | 6/1998 | Hsu et al. | 438/636 |
| 5,858,879 | 1/1999 | Chao et al. | 438/725 |
| 5,882,399 | 3/1999 | Ngan et al. | 117/89 |
| 5,925,225 | 7/1999 | Ngan et al. | 204/192.17 |

OTHER PUBLICATIONS

McKenzie, McFall and Yin, "Production of dense and oriented structures including titanium nitride by energetic condensation from plasmas", Nov. 4, 1995, Elsevier Science, University of Sydney, Sydney, Australia.

Jacobson, Luzzi, Heinz and Iwaki, "*Beam–Solid Interactions for Materials Synthesis and Characterization*", 1995, vol. 354, pp. 503–510, Materials Research Society Symposium Proceedings, Pittsburgh, PA.

Rossnagel and Hopwood, "*Metal ion deposition from ionized mangetron sputtering discharge*" Jan./Feb. 1994, J. Vac. Sci. Tech. B 12(1), pp. 449–453, IBM Research, New York.

J. Stimmell, "Properties of dc magnetron reactively sputtered TiN", Aug. 7, 1986, J. Vac. Sci. Tech. B 4 (6), pp. 1377–1382, National Semiconductor, Santa Clara, CA.

Kawamura, Abe, Yanagisawa and Sasaki, "Characterization of TiN films by a conventional magnetron sputtering system: influence of nitrogen flow percentage and electrical properties", Jan. 17, 1996, Elsevier Science, pp. 115–119, Kitami, Japan.

Atwater, Dickinson, Lowndes, and Polman, "Film Synthesis and Growth Using Energetic Beams", Apr. 17–20, 1995, Mat. Res. Soc. Symp. Proc. vol. 388, pp. 103–108, San Francisco, CA.

Hara, Yamanoue, Iio, Inoue, Washizu and Nakamura, "*Properties of Titanium Nitride Films for Barrier Metal in Aluminum Ohmic Contact Systems*", Jul. 7, 1991, vol. 30, No. 7, pp. 1447–1451, Hosei University, Tokyo, Japan.

Rossnagel, Nichols, Hamaguchi, Ruzic, and Turkot, "Thin, high atomic weight refractory film deposition for diffusion barrier, adhesion layer, and seed layer applications", May/Jun. 1996, J. Vac. Sci. Tech. B 14(3), pp. 1819–1827, Yorktown Heights, New York.

Extended Abstract of the Electrochemical Society Spring Meeting, Los Angeles, California, May 1996, ECS, Pennington, New Jersey.

Abstract, "Application of Surface Reformed Thick Spin–On–Glass to MOS Device Planarization", Soc., vol. 137, No. 4, Apr. 1990, The Electrochemical Society.

S.J. Holmes, P.H. Mitchell and M.C. Hakey, "Manufacturing with DUV Lithography", IBM Journal of Research & Development, vol. 41, No. ½ Optical lithography, 1997 IBM.

H. Ito, "Chemical amplification resists: History and development within IBM", IBM Journal of Research & Development, vol. 41, No. ½ Optical lithography, 1997 IBM.

*Primary Examiner*—Christopher G. Young
*Attorney, Agent, or Firm*—Martine Penilla & Kim, LLP

[57] ABSTRACT

Disclosed is a method for making a metallization layered stack over an oxide layer of a semiconductor substrate, and a metallization layered stack that assists in providing superior deep UV photolithography resolution. The method includes forming a bottom titanium nitride layer over the oxide layer, and forming an aluminum metallization layer over the bottom titanium nitride layer. The method further includes forming a top titanium nitride layer over the aluminum metallization layer, such that the forming of the top titanium nitride layer includes: (a) placing the semiconductor substrate in an ionized metal plasma chamber having an RF powered coil and a titanium target; (b) introducing an argon gas and a nitrogen gas into the ionized metal plasma chamber; (c) pressuring up the ionized metal plasma chamber to a pressure of between about 10 mTorr and about 50 mTorr, whereby the top titanium nitride layer is formed as a dense titanium nitride film.

19 Claims, 8 Drawing Sheets

METHOD FOR SUBSTANTIALLY PREVENTING FOOTINGS IN CHEMICALLY AMPLIFIED DEEP ULTRA VIOLET PHOTORESIST LAYERS

BACKGROUND OF THE INVENTION

1. Field of the Invention

The present relates to the manufacture of semiconductor devices. More particularly, the present invention relates to techniques for improving the resolution of photoresist development in deep ultra violet photolithography processes.

2. Description of the Related Art

In the manufacture of semiconductor integrated circuits, many well known photolithography techniques are used to pattern the various functional features on different levels of an integrated circuit chip. Generally, photolithography involves selectively exposing regions of a photoresist coated silicon wafer to a light radiation pattern, and then developing the exposed photoresist in order to selectively protect regions of wafer layers, such as metallization layers, oxide dielectric layers, polysilicon layers, silicon layers, etc., from subsequent etching operations.

As is well known, photoresist is a light radiation-sensitive material that is typically spin-coated over a selected layer of a silicon wafer. The photoresist material is classified as either positive or negative depending on how it chemically reacts to light radiation during exposure. Positive photoresist, when exposed to radiation becomes more soluble and is thus more easily removed during the development process. In contrast, negative photoresist will generally become less soluble when exposed to radiation, thereby enabling the removal of non-exposed regions. Although traditional I-Line photolithography process works well for patterning features in the 0.35 micron technology and larger, as feature sizes in integrated circuits continue to shrink, the patterned photoresist has been exhibiting a number of resolution abnormalities.

To address this limitation, engineers have been implementing optics that enable the use of wavelengths that are shorter than traditional "I-line" wavelengths (i.e., 365 nm). For example, a number of common photolithography processes are now implementing deep ultra violet "DUV" wavelengths (e.g., 248 nm). As a result of implementing DUV wavelengths in the photolithography process, a number of chemically amplified DUV photoresists were also developed to better interact with the shorter wavelengths. Although the new chemically amplified DUV photoresists work relatively well, as smaller and smaller feature sizes are designed for higher performance integrated circuit devices, the resolution of these high performance designs have been exemplifying less than acceptable resolution due to poor photoresist development.

Figure 1A:
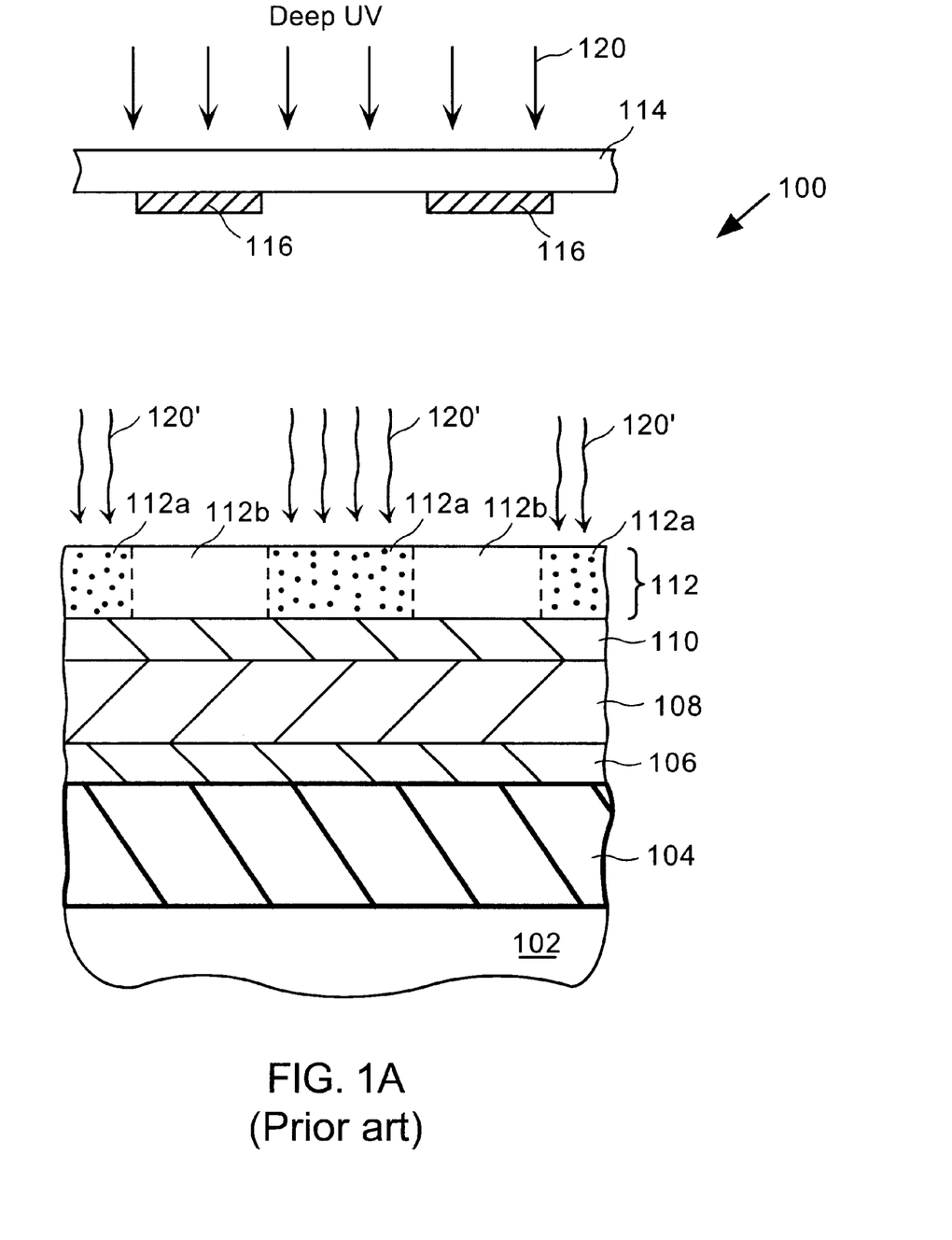
FIG. 1A shows a photoresist patterning system, which illustrates a simplified DUV photolithography process.

To exemplify this problem, FIG. 1A shows a photoresist patterning system 100, which illustrates a simplified DUV photolithography process. In this example, a semiconductor substrate 102 having several layers fabricated thereon is shown having a DUV photoresist layer 112. The semiconductor substrate 102 has an oxide layer 104, a titanium nitride layer 106, an aluminum metallization layer 108, and a titanium nitride layer 110. The layers 106, 108 and 110 are commonly referred to as a "metal-stack," which is patterned to define the electrical interconnection layout of a metallization layer. After one metal-stack is patterned, other subsequent metal-stacks may be patterned and interconnected using conductive contacts, thus forming a network of interconnect structures.

In order to pattern the metal-stack, the photoresist layer 112 is selectively exposed to the DUV light 120. To accomplish the selective exposure, the DUV light 120 is passed through a reticle 114 which has non-transparent regions 116. When the exposed photoresist is a "positive" DUV photoresist, exposed regions 112a will undergo a chemical reaction that generates an acid component. It is this acid component that catalyzes further acid generation, making exposed regions 112a more soluble than the non-exposed regions 112b during subsequent development. Typical development steps generally include performing a post exposure bake (PEB) on a hot plate, and then applying a developer solution.

Figure 1B:
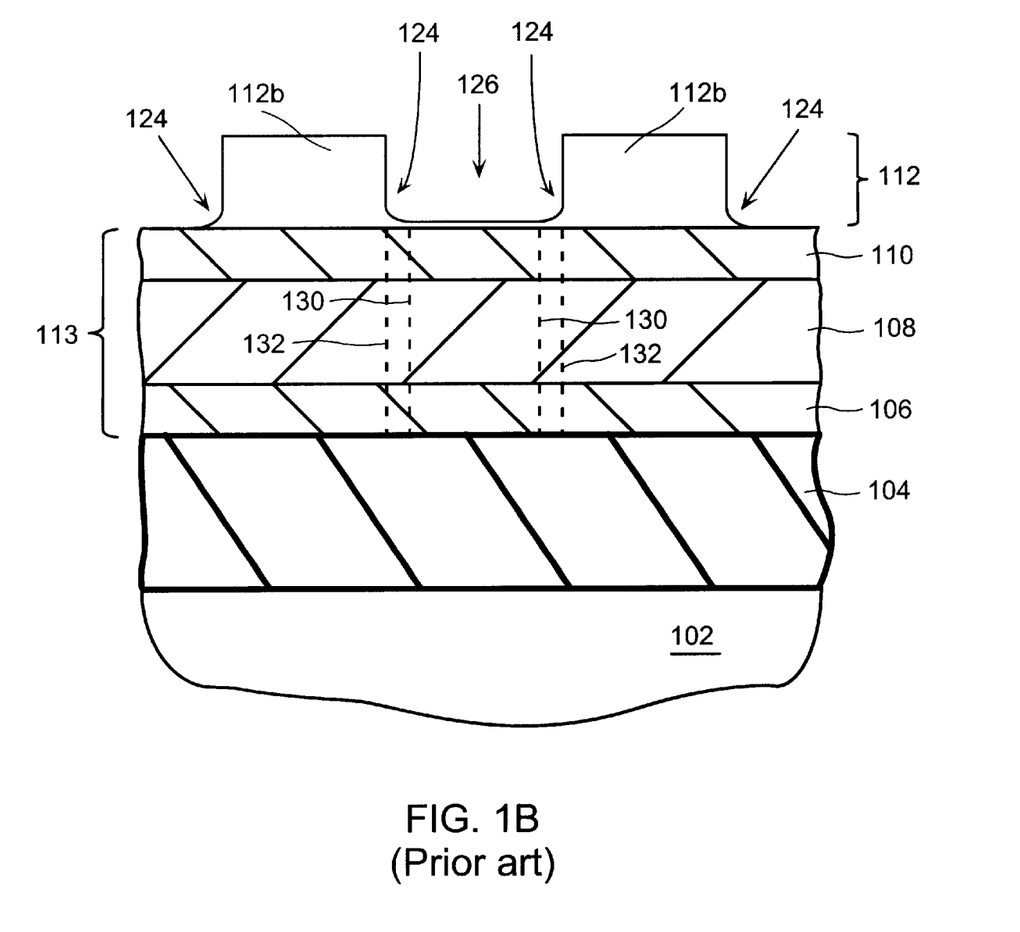
FIG. 1B shows the metal-stack of FIG. 1A after the photoresist layer has been developed.

FIG. 1B shows the metal-stack of FIG. 1A after the photoresist layer 112 has been developed. Ideally, all of the photoresist layer 112 lying in the exposed regions 112a should be vertically developed down to the titanium nitride layer 110 interface. Unfortunately, a residue of photoresist remains near the lower portions of the unexposed regions 112b producing what is known as a "footing" effect and other profile abnormalities. Specifically, footings 124 remain near the interface of the titanium nitride layer 110. In addition, a photoresist film 126 also sometimes remains on the surface of the titanium nitride layer 110 between the regions 112b. In the case of DUV photoresists, the footings 124 and film 126 are believed to result due to a loss of acid in the regions 112a after exposure and before development.

One reason for the acid loss in the exposed regions 112a is believed to occur when free surface nitrogen species of the titanium nitride layer 110 behave as a "Lewis base," which are partially neutralized by the generated acid component of the exposed photoresist layer 112. These nitrogen species are believed to contribute to the undesirable acid loss, which causes additional profile abnormalities that reduce the resolution of the developed photoresist 112.

Of course, when the photoresist layer 112 fails to develop as ideally desired, the etching of the underlying metal-stack will not reflect the desired patterns. As shown, if the photoresist had been ideally developed, lines 132 would most likely define the etched profile of the metal-stack. However, when the footings 124 result, lines 130 will define the true etched profile, which may fail to produce desired circuit performance specifications. The footing also degrades the profile control making the metal stack edge more sloped.

Figure 1C:
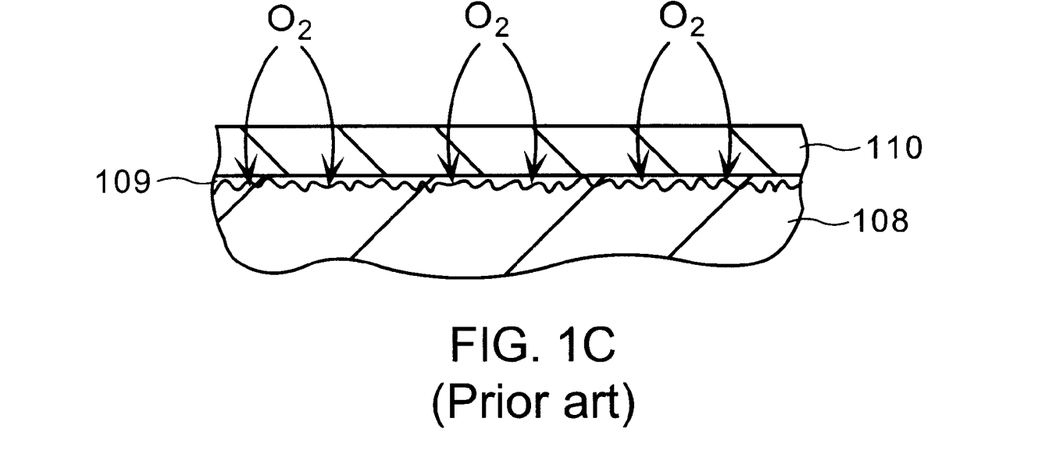
FIG. 1C shows a more detailed view of the interface between the titanium nitride layer and the aluminum metallization layer of FIGS. 1A and 1B.

FIG. 1C shows a more detailed view of the interface between the titanium nitride layer 110 and the aluminum metallization layer 108 of FIGS. 1A and 1B. Typically, after the titanium nitride layer 110 is sputtered in the PVD chamber, the wafer is moved to a photoresist applicator station, where a liquid photoresist material is applied over the titanium nitride layer 110 and then spin coated. However, during the time in which the wafer is moved from the PVD chamber to the photoresist applicator station and the liquid photoresist is applied, general ambient oxygen "$O_2$" will come into contact with the titanium nitride layer 110. Because the low pressure PVD chambers sputter the titanium nitride layer 110 forming a sparse molecular structure, some of the oxygen atoms are known to migrate through the titanium nitride layer 110 and come into direct contact with the aluminum metallization layer 108. The chemical interaction between the oxygen atoms and the aluminum will generally produce a film of aluminum oxide ($Al_2O_3$) 109. A drawback of the produced aluminum oxide film 109 is that a higher level of resistance is introduced into subsequently formed interconnect structures.

Figure 1D:
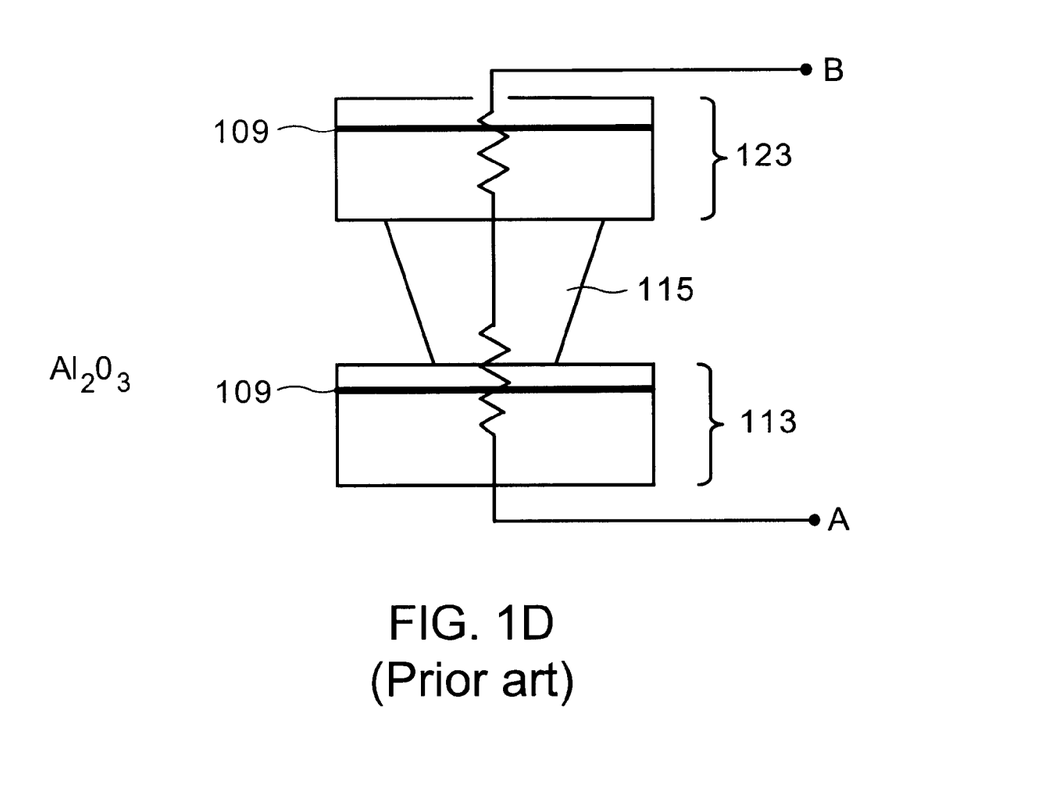
FIG. 1D illustrates a simplified interconnect structure between a first metal-stack and a second metal-stack.

FIG. 1D illustrates a simplified interconnect structure between a first metal-stack 113 and a second metal-stack 123. As is well known, the various metallization layers are interconnected through conductive contacts 115 to enable conduction between, for example, point A and point B. Unfortunately, the aluminum oxide film 109 will also introduce high resistance in the second metal-stack 123, thereby further increasing the resistance between points A and B. Consequently, circuit designers are forced to accept and account for this performance limiting drawback when new circuit designs are made.

In view of the foregoing, there is a need for methods and apparatus for improving the retention of generated acid during DUV photolithography processes in order to reduce resolution abnormalities in developed photoresist layers. There is also a need for techniques for reducing the formation of high resistance films in interconnect metal stacks during fabrication processes.

SUMMARY OF THE INVENTION

Broadly speaking, the present invention fills these needs by providing a photoresist resolution enhancing antireflective layer and methods for generating the antireflective layer. The invention also fills the need for an antireflective barrier layer that substantially reduces interconnect resistance. It should be appreciated that the present invention can be implemented in numerous ways, including as a process, an apparatus, a system, a device, or a method. Several inventive embodiments of the present invention are described below.

In one embodiment, a method for making a metallization layered stack over an oxide layer of a semiconductor substrate is disclosed. The method includes forming a bottom titanium nitride layer over the oxide layer, and forming an aluminum metallization layer over the bottom titanium nitride layer. The method further includes forming a top titanium nitride layer over the aluminum metallization layer, such that the forming of the top titanium nitride layer includes: (a) placing the semiconductor substrate in an ionized metal plasma chamber having an RF powered coil and a titanium target; (b) introducing an argon gas and a nitrogen gas into the ionized metal plasma chamber; (c) pressuring up the ionized metal plasma chamber to a pressure of between about 10 mTorr and about 50 mTorr, whereby the produced top titanium nitride layer is a dense titanium nitride film.

In another embodiment, a metal stack including a bottom titanium nitride layer, and an aluminum layer that is defined over the bottom titanium nitride layer is disclosed. The metal stack also includes a dense titanium nitride layer that is defined over the aluminum layer, and the dense titanium nitride layer has a grain size of between about 3 nanometers and about 80 nanometers and a thickness of between about 300 angstroms and about 800 angstroms. Further, the dense titanium nitride layer of the metal stack has a low count of free surface nitrogen species.

In yet another embodiment, a system for forming a dense antireflective layer that improves photolithography resolution is disclosed. The system includes providing a metallization layer, and depositing the dense antireflective layer over the metallization layer. The depositing includes: (a) placing a titanium target in an ionized metal plasma chamber; (b) introducing an argon gas and a nitrogen gas into the ionized metal plasma chamber; (c) pressuring up the ionized metal plasma chamber to a pressure of between about 10 mTorr and about 50 mTorr; and (d) powering up the RF coil in the ionized metal plasma chamber to between about 0.5 Kilowatts and about 4 Kilowatts and the DC cathode power to between 1 kilowatt and 12 kilowatts.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for a photoresist resolution enhancing antireflective layer and method for generating the antireflective layer is disclosed. Also disclosed is an antireflective barrier layer that substantially reduces interconnect resistance. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
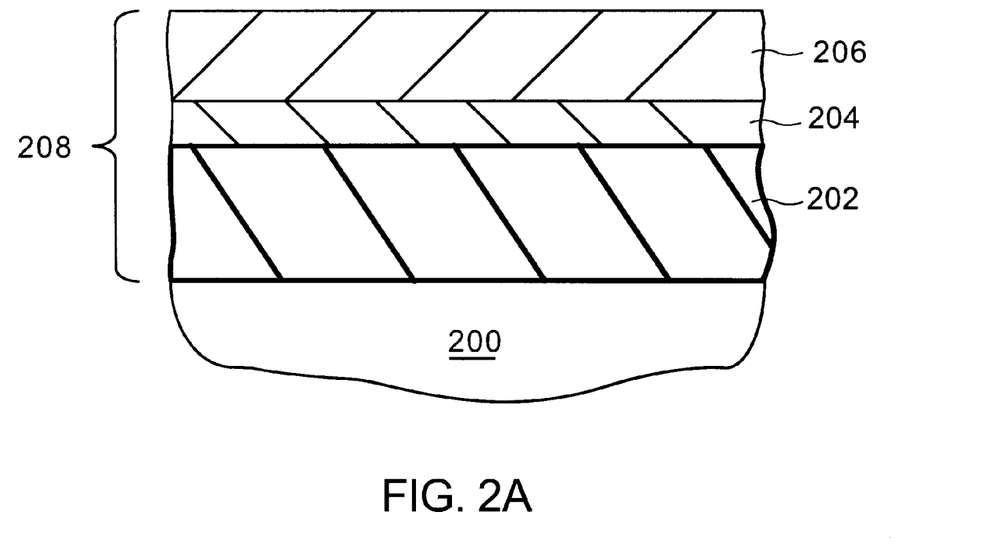
FIGS. 2A–2B shows cross sectional views of a semiconductor substrate having a number of fabricated layers formed thereon in accordance with one embodiment of the present invention.

FIG. 2A shows a cross sectional view of a semiconductor substrate 200 having a number of fabricated layers formed thereon in accordance with one embodiment of the present invention. Disposed over the semiconductor substrate 200 is a dielectric layer 202, which may be any insulating silicon dioxide (SiO$_2$) material. Once the dielectric layer 202 has been formed to a suitable thickness, a titanium nitride layer 204 is formed over the dielectric layer 202. The titanium nitride layer 204 is used to improve the reliability of a subsequently deposited aluminum metallization by enhancing its grain orientation and texture.

Alternatively, the titanium nitride layer 204 may be replaced with a titanium only layer, which also assists in providing good grain orientation and texture for the subsequently deposited aluminum metallization. After the titanium nitride layer 204 has been formed, the aforementioned aluminum metallization layer 206 is formed over the titanium nitride layer 204. In one embodiment, the aluminum metallization layer 206 has a preferred thickness of between about 3,000 angstroms and about 10,000 angstroms, and more preferably, between about 4,000 angstroms and about 7,000 angstroms, and most preferably about 5,000 angstroms.

Figure 2B:
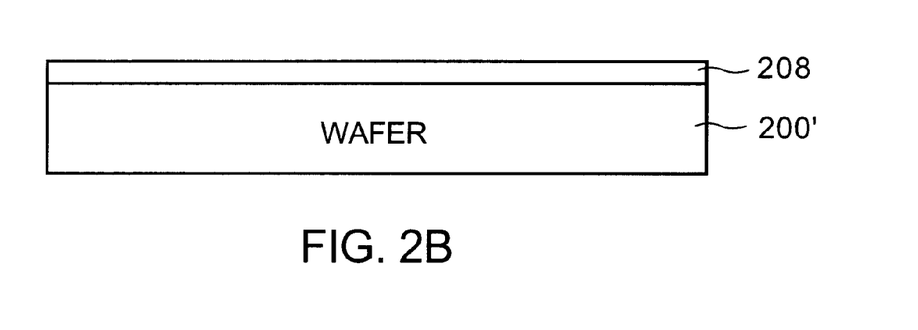

At this point, layers 204 and 206 substantially define a metal stack which is formed over an oxide material. As shown in FIG. 2B, layers 208 are formed over a semiconductor wafer 200'. Although the following discussion refers to the formation of a first metallization layer (i.e., Metal-1) over a first dielectric layer 202, the following process operations are typically repeated several times throughout a fabrication cycle to form multiple metallization levels having intermetal oxide (IMO) materials interposed between the respective metallization levels.

Figure 3A:
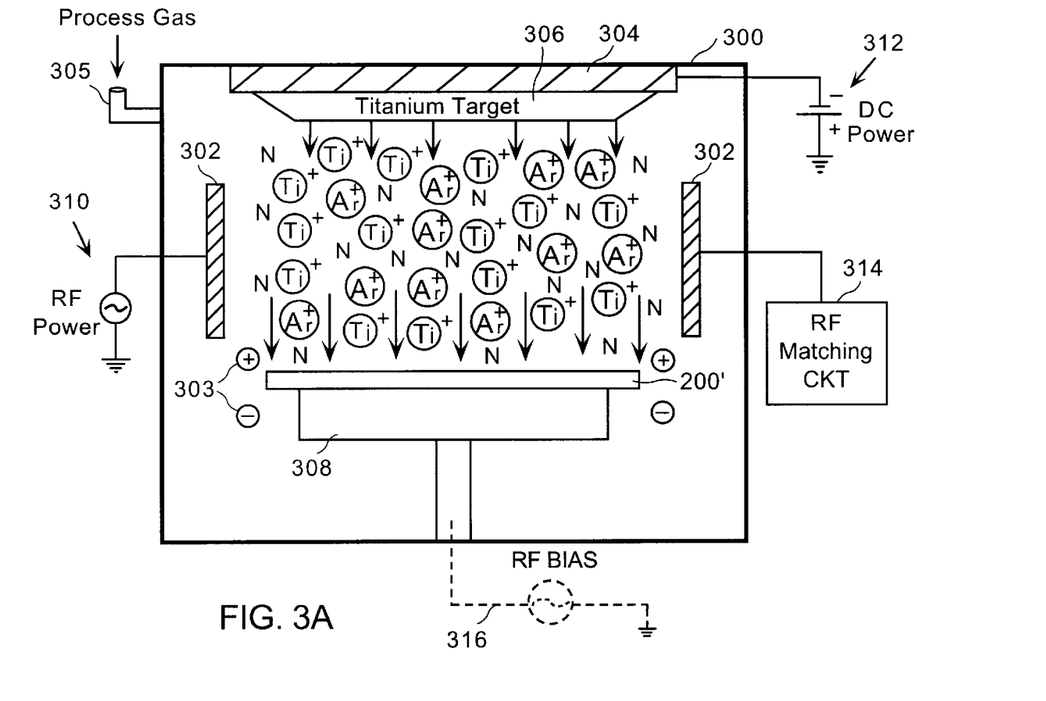
FIG. 3A shows a chamber that holds a semiconductor wafer being densely sputtered in accordance with one embodiment of the present invention.

Reference is now drawn to FIG. 3A which shows a chamber 300 that holds the semiconductor wafer 200' in accordance with one embodiment of the present invention. The chamber 300 includes a coil metal ribbon 302 which substantially surrounds the chamber 300 in a circular manner, however, only a cross sectional view of the coil 302 is shown herein. In this embodiment, the coil 302 has two ends which begin and end at about the same point, and one end of the coil 302 is coupled to an RF power source 310 and the other end is coupled to an RF matching circuit 314.

In one embodiment of the present invention, the RF power source 310 is configured to provide between about 0.5 kilowatts and about 4 kilowatts, and more preferably between about 1.5 kilowatts and about 3 kilowatts, and most preferably about 2.5 kilowatts during the preferred deposition operation. As will be described in greater detail below, the RF power source 310 and the coils 302 are well suited to generate an ionized metal plasma (IMP) between a titanium target 306 and the semiconductor wafer 200' in order to deposit a dense titanium nitride layer. When the preferred RF power is applied to the coil 302, an induced bias 303 is generated over the semiconductor wafer 200' (i.e., referred to as a plasma sheath).

This induced bias 303 at the wafer 200' surface assists in directionally attracting the sputtered and ionized titanium atoms. Additionally, the chamber 300 includes a plate 304 which is in direct contact with the titanium target 306. The plate 304 is coupled to a negative direct current (DC) power 312. The DC power 312 is preferably set to negatively charge the titanium target 306. The chamber 300 is also provided with an inlet 305 which is configured to receive the various process gasses used during the deposition of the dense titanium nitride layer. In this embodiment, an argon (Ar) gas having a flow rate of between about 3 standard cubic centimeters per minute (sccm) and about 50 sccm, and more preferably between about 5 sccm and about 25 sccm, and most preferably about 15 sccm is provided.

The chamber 300 is also provided with a nitrogen (N$_2$) gas having a preferred flow rate of between about 20 sccm and about 120 sccm, and more preferably between about 40 sccm and about 100 sccm, and most preferably about 90 sccm. Once the chamber 300 has been provided with the titanium target 306, the argon gas, and the nitrogen gas, the chamber 300 may be powered up to the desired deposition conditions. For example, the DC power 312 is powered up to between about 1 kilowatts and about 12 kilowatts, and most preferably about 5 kilowatts.

Further, the pedestal 308 is set to a temperature ranging between about 20 degrees Celsius and about 400 degrees Celsius, and more preferably between about 150 degrees Celsius and about 250 degrees Celsius, and most preferably about 200 degrees Celsius. In order to generate the desired pressure deposition conditions for forming the dense titanium nitride layer over the semiconductor wafer 200', the chamber 300 is brought to a preferred pressure ranging between about 10 milliTorr and about 50 milliTorr, and more preferably between about 20 milliTorr and about 40 milliTorr, and most preferably about 22 milliTorr.

Upon setting these preferred deposition conditions, the RF power source 310 will deliver the desired RF power to the coil 302 which induces the bias polarity in the semiconductor wafer 200'. Further, as mentioned above, the DC power 312 is electrically coupled to the titanium target 306 to negatively charge the titanium material. As pictorially shown in this simplified plasma illustration, the titanium target is bombarded with argon ions (Ar+) to produce titanium ions (Ti+). The ionized titanium is produced when the sputtered off titanium is caused to lose an electron (i.e., Ti−e=Ti+). This process therefore generates ionized magnetron sputtering, where the titanium atoms are sputtered into a medium density plasma having a preferred density of between about $1 \times 10^9$ ions/cm$^3$ and about $1 \times 10^{13}$ ions/cm$^3$, and more preferably between about $1 \times 10^{10}$ ions/cm$^3$ and about $1 \times 10^{12}$ ions/cm$^3$, and most preferably about $1 \times 10^{11}$ ions/cm$^3$.

Because the titanium is ionized, the Ti+ atoms will be directionally accelerated toward the surface of the semiconductor wafer 200' due to the RF induced bias 303 at the wafer surface. More specifically, because the ionized titanium is positively charged and negatively bias 303 exists the wafer surface, the titanium deposition occurs in a very directional manner, meaning that the titanium will directionally accelerate toward the semiconductor wafer 200' surface.

Additionally, the mean free path of the sputtered titanium will be substantially smaller than prior art low pressure deposition techniques because a higher concentration of molecules will be present in the chamber under the higher preferred chamber pressure conditions. As a result, a greater percentage of the sputtered titanium will become ionized (i.e., forming Ti+). In one embodiment of the present invention, it is believed that between about 10% and about 95% of the sputtered titanium will be ionized, and more preferably between about 20% and about 80% will be ionized, and about 40% of the sputtered titanium will be ionized. Because such a significant amount of the sputtered titanium is ionized, a larger amount of the titanium material will be directionally accelerated toward the surface of the semiconductor wafer 200', thereby producing a more densely deposited material.

Figure 3B:
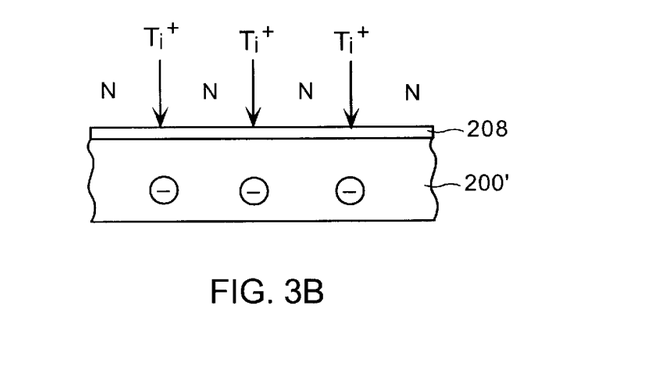
FIG. 3B shows the directionality of the sputtering process of FIG. 3A in accordance with one embodiment of the present invention.

In FIG. 3B, the ionized titanium is shown being accelerated toward the surface of the layers 208 because the semiconductor wafer 200' is negatively biased. In another embodiment, an RF bias 316 may be electrically coupled to the pedestal 308 to more actively apply a negative charge to the semiconductor substrate 200'. By applying this additional (optional) RF bias 316, the ionized titanium will be further attracted to the surface layer being deposited. Because the ionized titanium is accelerated to the surface, a very dense titanium nitride layer that has very few vacancies will be produced, as compared to those produced using conventional low pressure titanium nitride deposition techniques. Advantageously, the deposited dense titanium nitride layer will be well suited for subsequent DUV photolithography processes which critically depend on retaining generated acid once photolithography exposure has occurred.

Figure 4:
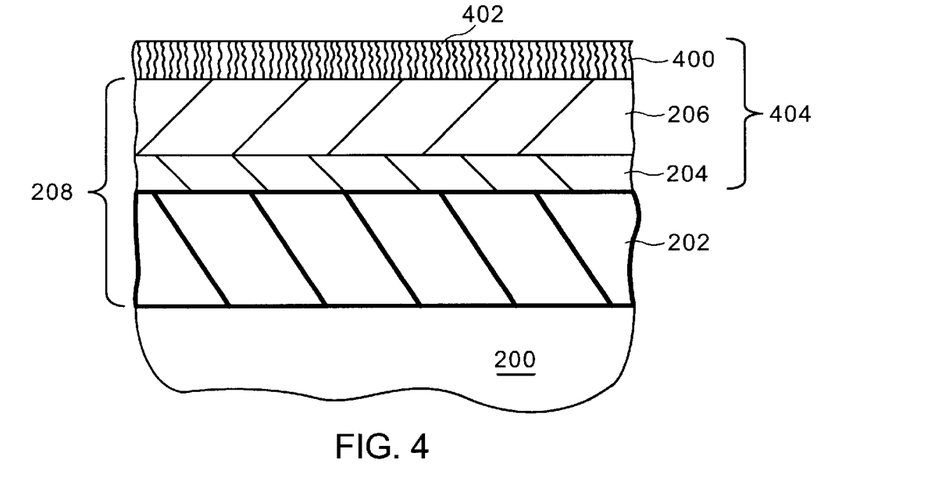
FIG. 4 which shows a dense titanium nitride layer formed over an aluminum metallization layer in accordance with one embodiment of the present invention.

Reference is now drawn to FIG. 4 which shows a dense titanium nitride layer 400 formed over the aluminum metallization layer 206 in accordance with one embodiment of the present invention. In this preferred embodiment, the dense titanium nitride layer 400 is preferably deposited to a thickness of between about 100 angstroms and about 3,000 angstroms, and more preferably, between about 300 angstroms and about 800 angstroms, and most preferably about 500 angstroms. Further, the dense titanium nitride layer 400 will exhibit a compact grain structure having grain sizes 402 ranging between about 3 nanometers and about 80 nanometers, and more preferably about 6 nanometers. This dense titanium nitride layer 400 therefore completes a metal stack 404, which includes the lower titanium nitride layer 204 and the aluminum metallization layer 206.

Although the dense titanium nitride layer 400 has a finer grain structure and is more densely packed than the conventional titanium nitride layers, about the same good optical antireflective properties are still maintained. In one exemplary comparison test shown in table A below, the optical properties of the prior art standard titanium nitride and the new dense titanium nitride layers were obtained.

TABLE A

| | Standard TiN | | Dense TiN | |
|---|---|---|---|---|
| Wavelength | n Reflectivity | k Extinction Coefficient | n Reflectivity | k Extinction Coefficient |
| 365 nm | 2.221 | 1.035 | 2.263 | 0.955 |
| 248 nm | 2.366 | 1.422 | 2.451 | 1.453 |

Figure 5A:
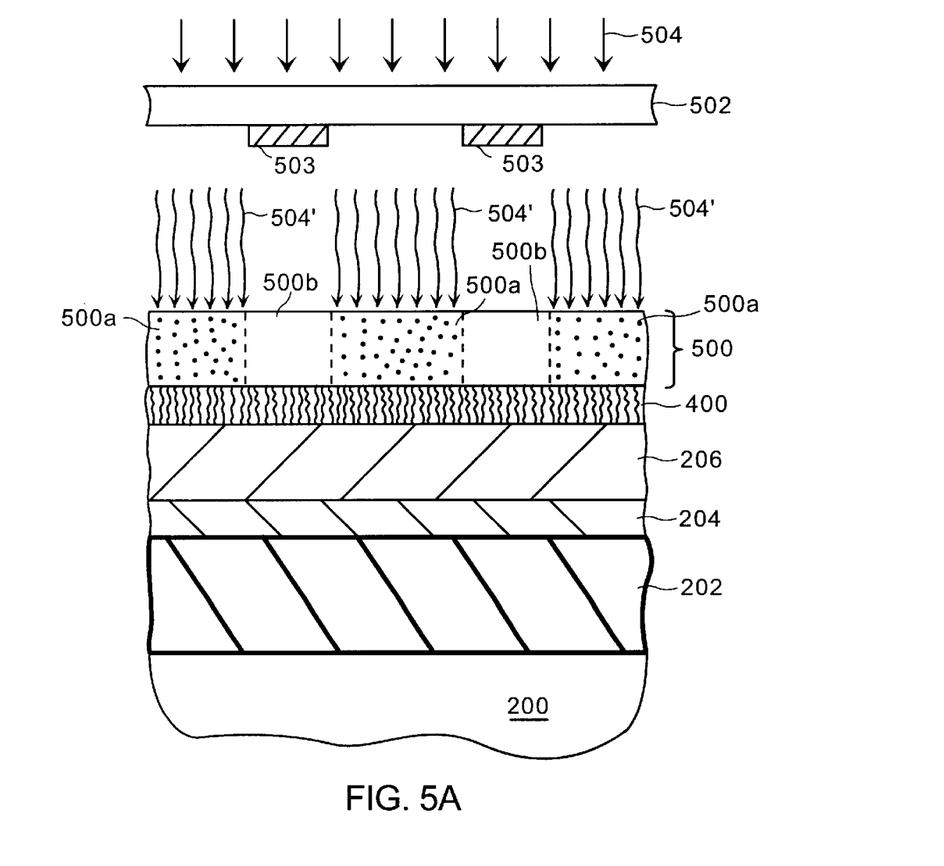
FIG. 5A shows the cross sectional view of FIG. 4 after a photoresist layer is applied over the surface of the dense titanium nitride layer in accordance with one embodiment of the present invention.

FIG. 5A shows the cross sectional view of FIG. 4 after a photoresist layer 500 is applied over the surface of the dense titanium nitride layer 400. As shown, a photolithography patterning operation in the deep UV will include using a photoresist that is chemically amplified in order to generate an acid component in exposed regions 500a and no acid in non-exposed regions 500b. Typically, a photolithography retical 502 will have dark regions 503 that are designed to filter out the deep UV light 504 being applied through a stepper apparatus.

Non-filtered light 504' is therefore allowed to come into contact with the photoresist layer 500 and produce exposed regions 500a. At this point, the exposed regions 500a are caused to generate an acid component which will assist in making that portion of the photoresist layer 500 more soluble during development. As mentioned above, the dense titanium nitride layer 400 will have fewer chemically reactive nitrogen species and will therefore substantially reduce the amount of acid neutralization that occurs, as compared to conventional titanium nitride layers. Advantageously, more of the generated acid present in the exposed regions 500a will remain to enable a more defined development of the photoresist layer 500.

Figure 5B:
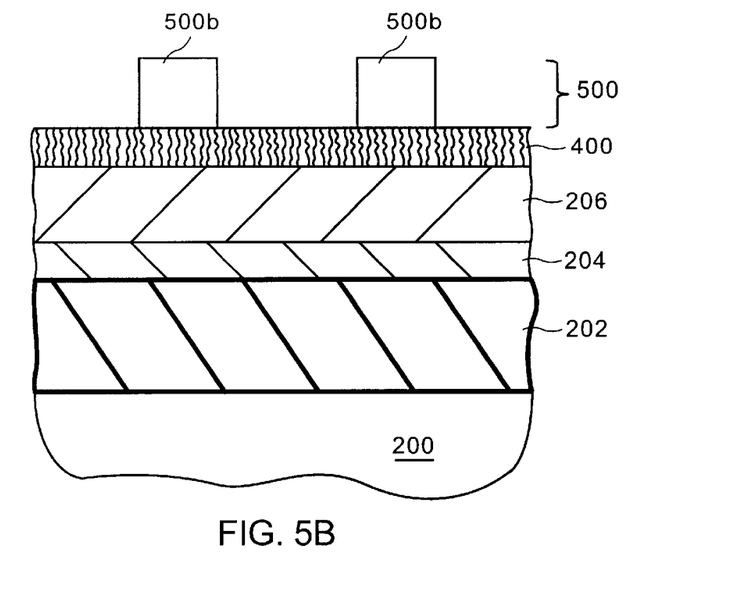
FIG. 5B shows the cross sectional view of FIG. 5A after the photoresist layer has been developed in a suitable developer in accordance with one embodiment of the present invention.

FIG. 5B shows the cross sectional view of FIG. 5A after the photoresist layer 500 has been developed in a suitable developer. In this development stage, the retained acid content of the exposed photoresist layer 500 will enable the remaining unexposed resist 500b to have a more defined structure which more closely resembles the desired patterned layouts for an integrated circuit device. For comparison purposes, reference should be made to FIG. 1B in which the footings 124 and the film 126 remain between the non-exposed regions of the photoresist layer 112.

Figure 5C:
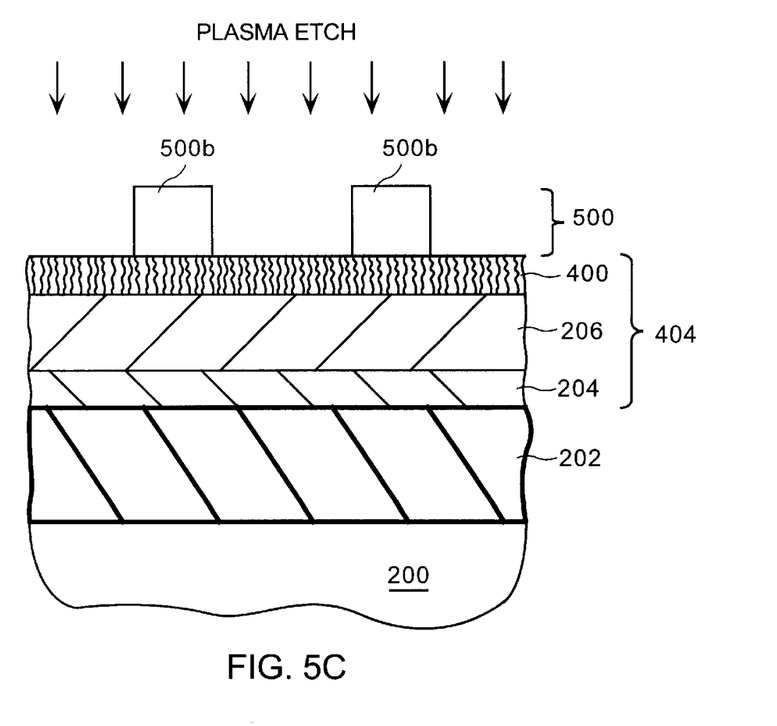
FIG. 5C shows a plasma etching operation being performed over the developed photoresist in accordance with one embodiment of the present invention.
Figure 5D:
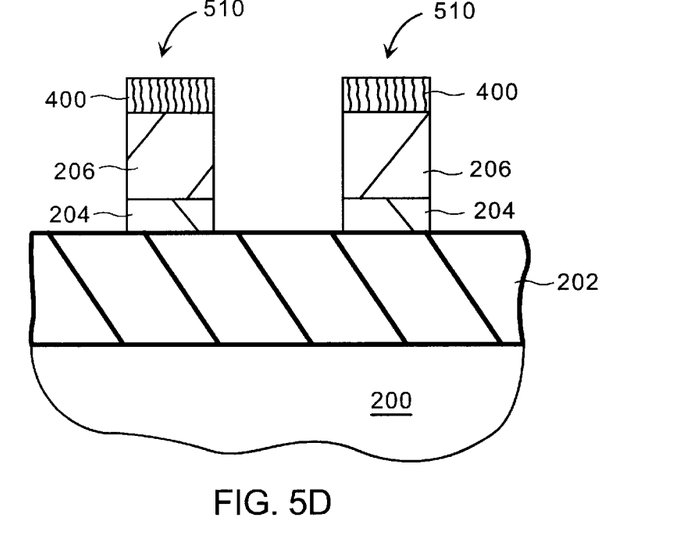
FIG. 5D illustrates the metallization lines that remain after the etching of FIG. 5C is complete in accordance with one embodiment of the present invention.

Once the photoresist is developed, a plasma etch operation is performed as shown in FIG. 5C in order to define the metallization patterns for the metal stack 404. Once the plasma etch operation has been performed through the metal stack 404, the resulting metallization lines 510 as shown in FIG. 5D will remain. It should be noted that the remaining metallization lines 510 are substantially better defined than if the photoresist resolution had been obscured by the footing and film residues of the prior art. This is even more so when the fact that device features are continuing to shrink, and more precision will be needed in order to meet the demand for higher performing smaller devices.

Figure 6:
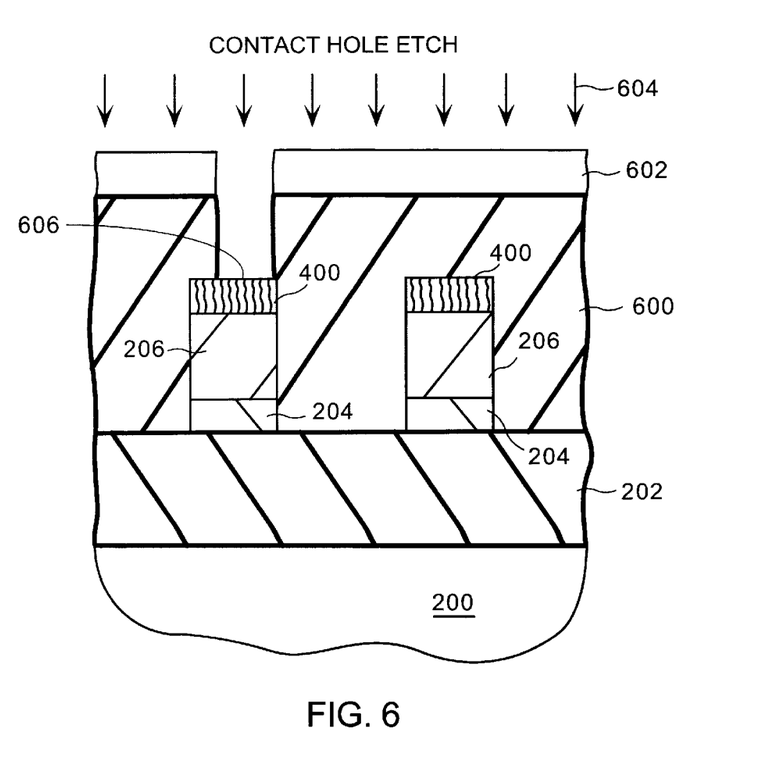
FIG. 6 shows the cross-sectional view of FIG. 5D after additional fabrication operations are performed in accordance with one embodiment of the present invention.

FIG. 6 shows the cross-sectional view of FIG. 5D after additional fabrication operations are performed in accordance with one embodiment of the present invention. In this embodiment, an intermetal oxide layer 600 has been deposited over the surface of the oxide layer 202 and the metallization lines 510. In order to make an electrical interconnection to one of the metallization lines 510, a via hole is etched down to the top surface of the dense titanium nitride layer 400.

As an advantage, because the dense titanium nitride layer 400 is substantially more resistant to normal etching chemistries used to etch the oxide via holes and is also more resistant than the standard titanium nitride layers, the dense titanium nitride layer 400 will serve as an excellent "etch-stop." Most importantly, the benefits of having good etch-stop characteristics are provided without increasing processing complexities or introducing additional fabrication steps beyond these described above.

Yet another advantage of the dense titanium nitride layer 400 is that it forms a barrier shield to oxygen atoms, which in the prior art contributed to increased interconnect resistance. Specifically, as mentioned with reference to FIGS. 1C and 1D, when oxygen is allowed to penetrate the titanium nitride layer 110, a highly resistive aluminum oxide ($Al_2O_3$) is formed. However, because of the compact structure of the dense titanium nitride layer 400, substantially fewer oxygen atoms will be allowed to come into contact with the underlying aluminum metallization layer. As a result, less resistive interconnect structures may be fabricated, which in turn contributes to faster higher performing integrated circuit devices.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for substantially preventing footings from forming in a chemically amplified deep ultra violet photoresist layer upon exposure and development of the layer to improve the resolution of the development of the chemically amplified deep ultra violet photoresist layer in deep ultra violet photolithography processes, comprising the operations of:

forming a bottom titanium nitride layer over an oxide layer of a semiconductor substrate;

forming an aluminum metallization layer over the bottom titanium nitride layer; and substantially preventing the formation of footings in the exposed and developed chemically amplified deep ultra violet photoresist layer by forming a top titanium nitride layer over the aluminum metallization layer and before forming the chemically amplified deep ultra violet photoresist layer over the top titanium nitride layer, the top titanium nitride layer being a dense titanium nitride film having a grain size of between about 3 nanometers and about 80 nanometers, the forming of the top titanium nitride layer including, placing the semiconductor substrate in an ionized metal plasma chamber having an RF powered coil and a titanium target;

introducing an argon gas and a nitrogen gas into the ionized metal plasma chamber; and pressuring up the ionized metal plasma chamber to a pressure of between about 10 mTorr and about 50 mTorr;

whereby the dense titanium nitride film substantially resists combination with components of the exposed chemically amplified deep ultra violet photoresist layer to prevent the formation of footings in the exposed and developed chemically amplified deep ultra violet photoresist layer formed over the dense titanium nitride film.

2. A method as recited in claim 1, wherein the forming of the top titanium nitride layer further includes:

powering up the RF powered coil of the ionized metal plasma chamber to between about 0.5 Kilowatts and about 4 Kilowatts in order to induce a negative biasing of the semiconductor substrate.

3. A method as recited in claim 2, wherein the forming of the top titanium nitride layer further includes:

applying a negative direct current bias to the titanium target.

4. A method as recited in claim 1, wherein the introducing of the argon gas and the nitrogen gas further includes:

supplying a flow rate of the argon gas that is between about 3 sccm and about 50 sccm into the ionized metal plasma chamber; and supplying a flow rate of the nitrogen gas that is between about 20 sccm and about 120 sccm into the ionized metal plasma chamber.

5. A method as recited in claim 1, wherein the forming of the top titanium nitride layer further includes:

sputtering a portion of the titanium target to produce titanium atoms which are caused to be ionized in the ionized metal plasma chamber to produce titanium ions; and directing the titanium ions and nitrogen atoms of the nitrogen gas toward the aluminum metallization layer to produce the dense titanium nitride film.

6. A method as recited in claim 1, wherein the top titanium nitride layer is formed to a thickness of between about 100 angstroms and about 3,000 angstroms.

7. A method as recited in claim 1, further comprising:

spin coating a chemically amplified photoresist over the dense titanium nitride film;

exposing a portion of the chemically amplified photoresist to cause a generation of acid in the portion; and developing the chemically amplified photoresist to remove the portion without leaving a footing over the dense titanium nitride film.

8. A method as recited in claim 7, wherein the top titanium nitride layer defines a barrier that substantially reduces neutralization of the acid in the portion.

9. A method as recited in claim 6, wherein the top titanium nitride layer substantially serves as an etch stop layer during a subsequent etching step.

10. A method as recited in claim 1, wherein the top titanium nitride layer defines an oxygen shield that substantially prevents the aluminum metallization layer from reacting with oxygen.

11. A method for substantially preventing footings from forming in a chemically amplified deep ultra violet photoresist layer upon exposure and development of the layer to improve the resolution of photoresist development in deep ultra violet photolithography processes, comprising the operations of:

forming a bottom titanium nitride layer over an oxide layer of a semiconductor substrate;

forming an aluminum metallization layer over the bottom titanium nitride layer;

forming a top titanium nitride layer over the aluminum metallization layer spin coating chemically amplified deep ultra violet photoresist over the top titanium nitride layer;

exposing a portion of the chemically amplified photoresist to cause a generation of acid in the portion;

developing the exposed portion to remove the exposed portion of the chemically amplified photoresist; and substantially preventing the formation of footings in the exposed and developed portion of the chemically amplified deep ultra violet photoresist formed over the dense titanium nitride film by forming the top titanium nitride layer over the aluminum layer as a dense titanium nitride film having a grain size of between about 3 nanometers and about 80 nanometers, the forming of the top titanium nitride layer including, placing the semiconductor substrate in an ionized metal plasma chamber having an RF powered coil and a titanium target;

introducing an argon gas and a nitrogen gas into the ionized metal plasma chamber;

pressuring up the ionized metal plasma chamber to a pressure of between about 10 mTorr and about 50 mTorr; and supplying a radio frequency (RF) bias to the ionized metal plasma chamber;

whereby the dense titanium nitride film substantially resist combination of nitrogen from the dense titanium film with the acid in the portion of the exposed chemically amplified deep ultra violet photoresist layer so that the developing operation removes substantially all of the exposed portion to substantially prevent the formation of footings in the exposed and developed portion of the chemically amplified deep ultra violet photoresist layer formed over the dense titanium nitride film.

12. A method as recited in claim 11, wherein the forming of the top titanium nitride layer further includes:

powering up the RF powered coil of the ionized metal plasma chamber to between about 0.5 Kilowatts and about 4 Kilowatts in order to induce a negative biasing of the semiconductor substrate.

13. A method as recited in claim 12, wherein the forming of the top titanium nitride layer further includes:

applying a negative direct current bias to the titanium target.

14. A method as recited in claim 11, wherein the introducing of the argon gas and the nitrogen gas further includes:

supplying a flow rate of the argon gas that is between about 3 sccm and about 50 sccm into the ionized metal plasma chamber; and supplying a flow rate of the nitrogen gas that is between about 20 sccm and about 120 sccm into the ionized metal plasma chamber.

15. A method as recited in claim 11, wherein the forming of the top titanium nitride layer further includes:

sputtering a portion of the titanium target to produce titanium atoms which are caused to be ionized in the ionized metal plasma chamber to produce titanium ions; and directing the titanium ions and nitrogen atoms of the nitrogen gas toward the aluminum metallization layer to produce the dense titanium nitride film.

16. A method as recited in claim 11, wherein the top titanium nitride layer is formed to a thickness of between about 100 angstroms and about 3,000 angstroms.

17. A method as recited in claim 11, wherein the top titanium nitride layer defines a barrier that substantially reduces neutralization of the acid in the portion.

18. A method as recited in claim 11, wherein the top titanium nitride layer substantially serves an etch stop layer during a subsequent etching step.

19. A method as recited in claim 11, wherein the top titanium nitride layer defines an oxygen shield that substantially prevents the aluminum metallization layer from reacting with oxygen.

* * * * *